(12) United States Patent
Cheng et al.

(10) Patent No.: US 9,907,173 B2
(45) Date of Patent: *Feb. 27, 2018

(54) ELECTRONIC DEVICE HAVING A PERIPHERAL COMPONENT INTERCONNECT EXPRESS (PCI EXPRESS, PCI-E) INSERT ROW AND CIRCUIT MODULE THEREOF

(71) Applicant: ALSON TECHNOLOGY LIMITED, Kowloon (HK)

(72) Inventors: Han-Hung Cheng, Zhubei (TW); Chi-Fen Kuo, Zhubei (TW)

(73) Assignee: ALSON TECHNOLOGY LIMITED, Kowloon (HK)

( * ) Notice: Subject to any disclaimer, the term of this patent is extended or adjusted under 35 U.S.C. 154(b) by 171 days.

This patent is subject to a terminal disclaimer.

(21) Appl. No.: 14/940,977

(22) Filed: Nov. 13, 2015

(65) Prior Publication Data

US 2017/0142833 A1    May 18, 2017

(51) Int. Cl.
| | |
|---|---|
| F21S 4/00 | (2016.01) |
| H05K 1/18 | (2006.01) |
| G06F 1/18 | (2006.01) |
| G09F 13/04 | (2006.01) |
| G09F 23/00 | (2006.01) |

(52) U.S. Cl.
CPC ............. *H05K 1/18* (2013.01); *G06F 1/185* (2013.01); *G09F 13/04* (2013.01); *G09F 23/00* (2013.01); *H05K 2201/10106* (2013.01)

(58) Field of Classification Search
CPC ............ H05K 1/18; H05K 2201/10106; G06F 1/185; G09F 13/04; G09F 23/00
USPC ..................................................... 362/249.06
See application file for complete search history.

(56) References Cited

U.S. PATENT DOCUMENTS

2011/0296257 A1* 12/2011 Cao .................. G06F 11/2284
714/57

FOREIGN PATENT DOCUMENTS

TW            M448772 U        3/2013

OTHER PUBLICATIONS

English Translation of TWM448772 (U) (Nov. 2013).*

* cited by examiner

*Primary Examiner* — Andrew Coughlin
*Assistant Examiner* — Hana Featherly
(74) *Attorney, Agent, or Firm* — Muncy, Geissler, Olds & Lowe, P.C.

(57) ABSTRACT

An electronic device and a circuit module thereof are provided. The circuit module includes a main body, a light-emitting portion and a PCI-E insert row, the main body has a substrate and a first coating layer, the substrate has a light-transmittable portion and a first face, the first coating layer is coated on the first face, the first coating layer has an emergent light-transmittable portion corresponding to the light-transmittable portion. The light-emitting portion is buried in the substrate. The PCI-E insert row is disposed on the substrate. The electronic device includes the circuit module mentioned above and further includes a shell portion. The shell portion is covered on two opposite lateral faces of the circuit module, and the shell portion further has a second light-transmittable portion corresponding to the emergent light-transmittable portion.

10 Claims, 4 Drawing Sheets

ELECTRONIC DEVICE HAVING A PERIPHERAL COMPONENT INTERCONNECT EXPRESS (PCI EXPRESS, PCI-E) INSERT ROW AND CIRCUIT MODULE THEREOF

BACKGROUND OF THE INVENTION

Field of the Invention

The present invention relates to an electronic device and a circuit module thereof.

Description of the Prior Art

An electronic device and a circuit module thereof as disclosed in TWM448772 includes a main body, at least one light-emitting diode and at least one translucent light-guiding body. The light-emitting diode is disposed in the main body and electrically connected with the main body, the light-guiding body is disposed on the main body and covers the light-emitting diode, and light from the light-emitting diode can penetrate through the light-guiding body.

However, when this type of the circuit module is in actual practice, the light-guiding body needs to be further covered on the light-emitting diode; therefore, the circuit module is too thick, and the manufacturing cost is higher.

The present invention has arisen to mitigate and/or obviate the afore-described disadvantages.

SUMMARY OF THE INVENTION

The major object of the present invention is to provide an electronic device and a circuit module thereof, wherein light is emitted through a light-emitting portion embedded in a substrate and an emergent light-transmittable portion of a coating layer without a light-guiding portion which needs to be further disposed. Therefore, a thickness of the present invention decreases, and a manufacturing cost of the present invention is lower.

To achieve the above and other objects, a circuit module is provided, including a main body, a light-emitting portion and a Peripheral Component interconnect Express (PCI Express, PCI-E) insert row. The main body includes a substrate and a first coating layer, the substrate has a light-transmittable portion and a first face, the first coating layer is coated on the first face, the first coating layer has an emergent light-transmittable portion corresponding to the light-transmittable portion. The light-emitting portion is embedded in the substrate, and light from the light-emitting portion can be projected to the light-transmittable portion and projected through the emergent light-transmittable portion to an exterior of the circuit module. The PCI-E insert row is disposed on the substrate.

To achieve the above and other objects, an electronic device is further provided, including the circuit module mentioned above, and further including a shell portion. The shell portion is covered on two opposite lateral faces of the circuit module. The shell portion further has a second light-transmittable portion corresponding to the emergent light-transmittable portion, and light projected from the emergent light-transmittable portion can be projected through the second light-transmittable portion to an exterior of the electronic device.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
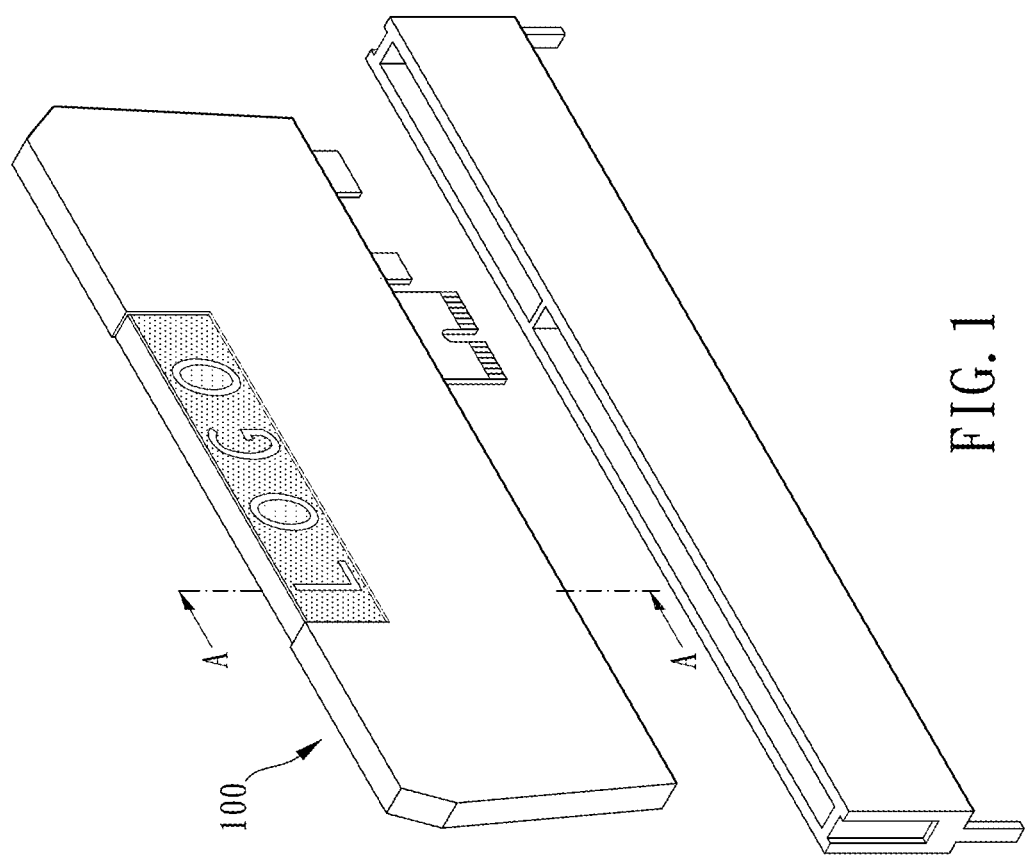
FIG. 1 is a perspective view of a preferred embodiment of the present invention.
Figure 2:
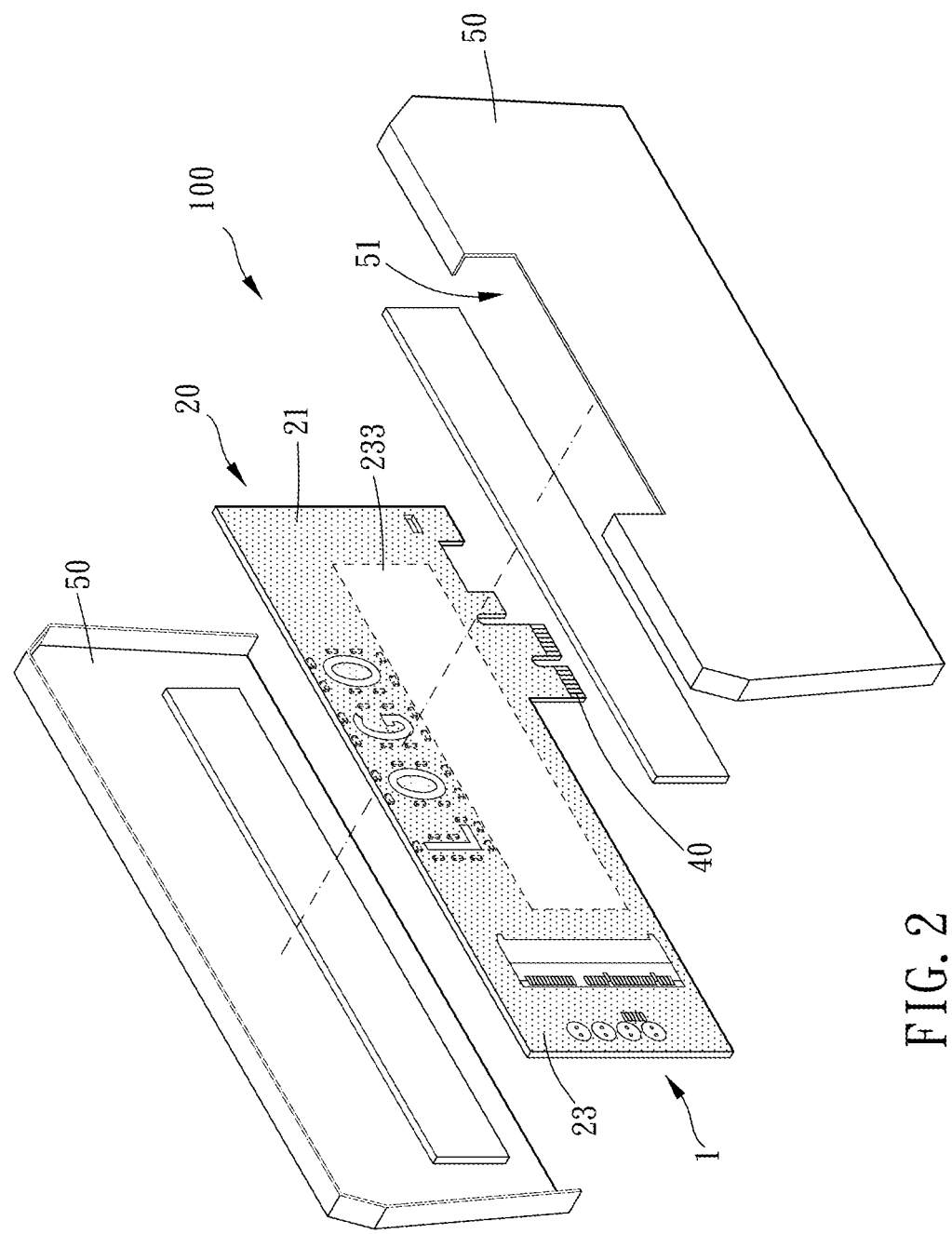
FIG. 2 is a breakdown view of the preferred embodiment of the present invention.
Figure 3:
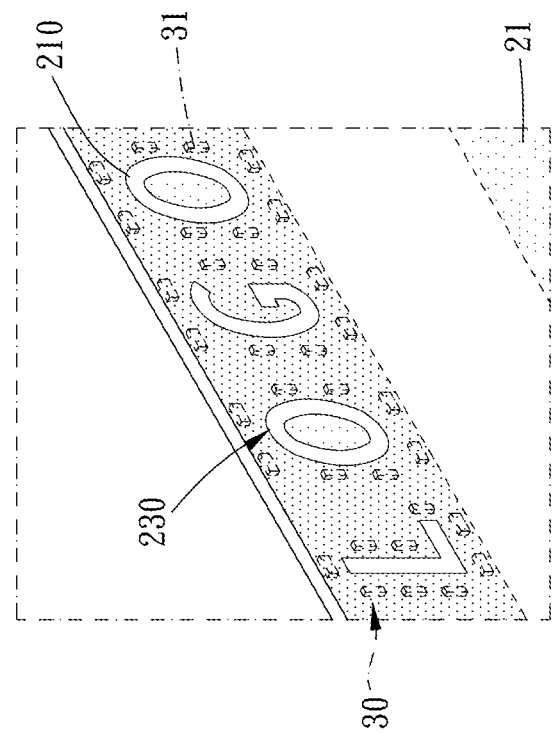
FIG. 3 is a partially-enlarged view of the preferred embodiment of the present invention.
Figure 4:
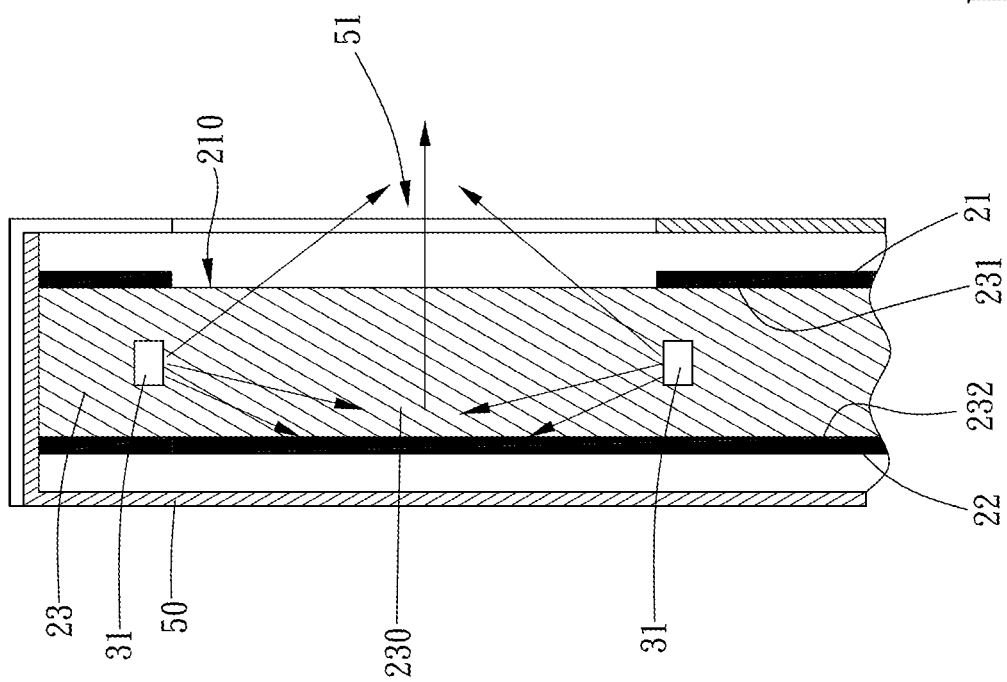
FIG. 4 is a cross-sectional view of the present invention, taken along line A-A in FIG. 1.

Please refer to FIGS. 1 to 4 for an electronic device 100 and a circuit module 1 thereof of a preferred embodiment of the present invention. The circuit module 1 includes a main body 20, a light-emitting portion 30 and a Peripheral Component Interconnect Express (PCI Express, PCI-E) insert row 40.

The main body 20 includes a substrate 23 and a first coating layer 21. Specifically, the substrate 23 has a light-transmittable portion 230 and a first face 231, the first coating layer 21 is coated on the first face 231, the first coating layer 21 is formed with an emergent light-transmittable portion 210 corresponding to the light-transmittable portion 230. In this embodiment, the first coating layer 21 at least shields a part of the light-emitting portion 30. Specifically, the first coating layer 21 shields the light-emitting portion 30 thoroughly, the light from the light-emitting portion 30 is guided (refracted or reflected) through the light-transmittable portion 230 and transmitted to the emergent light-transmittable portion 210 so that the light projected is softer. In other embodiments, the light-emitting portion may be not shielded by the first coating layer and be arranged facing the emergent light-transmittable portion; or, the light-emitting portion is partially shielded.

The light-emitting portion 30 is embedded in the substrate 23, and the light from the light-emitting portion 30 can be projected to the light-transmittable portion 230 and projected through the emergent light-transmittable portion 210 to an exterior of the circuit module 1. It is to be noted that the substrate 23 is a translucent board of a normal printed circuit board. In other embodiments, the light-transmittable portion may be a layer made of a light-transmittable material, and other parts of the substrate may be a layer made of a light-nontransmittable material so that a light-emitting face of the light-emitting portion (which may be partially embedded in the layer made of the light-nontransmittable material) faces the light-transmittable portion directly to emit light; or, the light-transmittable portion is a hollow-out structure, and the light-emitting face of the light-emitting portion is exposed through the hollow-out structure.

The substrate 23 is provided with an electronic unit 233, and the electronic unit 233 is electrically connected with the PCI-E insert row 40. The electronic unit 233 may be a graphic processing module, a display processing module or other processing modules so that the circuit module 1 can serve as a graphic card, a display card or other devices. The PCI-E insert row 40 is disposed on the substrate 23, and the PCI-E insert row 40 is electrically connected with the electronic unit 233. More specifically, the light-emitting portion 30 is also electrically connected with the PCI-E insert row 40 (of course, the light-emitting portion may be further electrically connected with other exterior powers such as a mother board). It is understandable that the PCI-E insert row 40 can transmit not only electricity but also data.

In this embodiment, the substrate 23 further has a second face 232 opposite to the first face 231, the main body 20 includes a second coating layer 22 coated on the second face 232, and the second coating layer 22 at least shields a part of the light-emitting portion 30 (the second coating layer may also not shield the light-emitting portion and allow the light to penetrate directly).

In this embodiment, the first coating layer 21 and the second coating layer 22 are insulting coating layers of a normal circuit board. The emergent light-transmittable portion 210 is a hollow-out structure which is not coated. In other embodiments, the emergent light-transmittable portion may be a layer made of a light-transmittable material. Specifically, the emergent light-transmittable portion 210 is a light-transmittable pattern portion (for example, a trademark) so that the present invention is more appealing when being viewed from outside.

Specifically, the light-emitting portion 30 includes a plurality of light-emitting diodes 31 which are embedded in the substrate 23 along a contour of the emergent light-transmittable portion 210 so that light projected from the emergent light-transmittable portion 210 is brighter and more even.

The electronic device 100 includes the circuit module 1 mentioned above and further includes a shell portion 50.

The shell portion 50 is covered on two opposite lateral faces of the circuit module 1. The shell portion 50 further has a second light-transmittable portion 51 corresponding to the emergent light-transmittable portion 210, and the light projected from the emergent light-transmittable portion 210 can be projected through the second light-transmittable portion 51 to an exterior of the electronic device 100. It is understandable that the second light-transmittable portion 51 may be a hollow-out structure or a layer made of a light-transmittable material.

In this embodiment, the shell portion 50 is a heat-dissipating shell portion (the shell portion may made of, for example, a metal) to prevent the circuit module 1 from overheating.

Given the above, the electronic device and the circuit module thereof, wherein light is emitted through the light-emitting portion embedded in the substrate and the emergent light-transmittable portion of the coating layer without a light-guiding portion which needs to be further disposed. Therefore, a thickness of the present invention decreases, and a manufacturing cost of the present invention is lower.

While we have shown and described various embodiments in accordance with the present invention, it should be clear to those skilled in the art that further embodiments may be made without departing from the scope of the present invention.

What is claimed is:

1. A circuit module, including: a main body, including a substrate and a first coating layer, the substrate having a light-transmittable portion and a first face, the first coating layer being coated on the first face, the first coating layer being formed with an emergent light-transmittable portion corresponding to the light-transmittable portion; a light-emitting portion, embedded in the substrate, light from the light-emitting portion being projected to the light-transmittable portion and projected through the emergent light-transmittable portion to an exterior of the circuit module; a Peripheral Component Interconnect Express (PCI Express, PCI-E) insert row, disposed on the substrate.

2. The circuit module of claim 1, wherein the first coating layer at least shields a part of the light-emitting portion.

3. The circuit module of claim 1, wherein the substrate further has a second face opposite to the first face, the main body further includes a second coating layer coated on the second face, and the second coating layer at least shields a part of the light-emitting portion.

4. The circuit module of claim 1, wherein the light-emitting portion includes a plurality of light-emitting diodes which are embedded in the substrate along a contour of the emergent light-transmittable portion.

5. The circuit module of claim 4, wherein the emergent light-transmittable portion is a light-transmittable pattern portion.

6. The circuit module of claim 1, wherein the emergent light-transmittable portion is a hollow-out structure or a layer made of a light-transmittable material.

7. A circuit module of claim 1, wherein the substrate is provided with an electronic unit, the electronic unit is electronically connected with the PCI-E insert row, and the electronic unit is either a graphic processing module or a display processing module.

8. An electronic device, including the circuit module of claim 1, further including:
a shell portion, covered on two opposite lateral faces of the circuit module, the shell portion having a second light-transmittable portion corresponding to the emergent light-transmittable portion, and light projected from the emergent light-transmittable portion being projectable through the second light-transmittable portion to an exterior of the electronic device.

9. The electronic device of claim 8, wherein the second light-transmittable portion is a hollow-out structure or a layer made of a light-transmittable material.

10. The electronic device of claim 8, wherein the shell portion is a heat-dissipating shell portion.

* * * * *